United States Patent [19]

Yokono et al.

[11] Patent Number: 5,393,406
[45] Date of Patent: Feb. 28, 1995

[54] METHOD OF PRODUCING A THIN FILM MULTILAYER WIRING BOARD

[75] Inventors: Hitoshi Yokono, Toride; Hideo Arima, Yokohama; Takashi Inoue, Yokohama; Naoya Kitamura, Yokohama, all of Japan

[73] Assignee: Hitachi, Ltd., Tokyo, Japan

[21] Appl. No.: 845,942

[22] Filed: Mar. 4, 1992

[30] Foreign Application Priority Data

Mar. 6, 1991 [JP] Japan .................................. 3-039833

[51] Int. Cl.$^6$ ............................................... C25D 5/02
[52] U.S. Cl. ..................................... 205/125; 205/126
[58] Field of Search ............................ 205/125, 126; C25D 5/02; 29/846

[56] References Cited

U.S. PATENT DOCUMENTS 4,920,639 5/1990 Yee ........................................ 29/846

OTHER PUBLICATIONS

Rao R. Tummala, *Microelectronics Packaging Handbook*, Van Nostrand Reinhold, pp. 710–714, 1989.

Primary Examiner—John Niebling
Assistant Examiner—William T. Leader
Attorney, Agent, or Firm—Antonelli, Terry, Stout & Kraus

[57] ABSTRACT

A thin film multilayer wiring board-producing method of the present invention is intended to decrease thermal stresses developing during the formation of the multilayer construction, and also to greatly reduce the number of the steps of the process, as compared with a conventional method. A film material can be used as an insulating film of the multilayer wiring board, and is adhesively bonded to a predetermined portion. Wiring conductors are formed by electroplating. The wiring layers are repeated laminated to form the multilayer construction. A metallic film serving as an electrode is formed on one of upper and lower surfaces of a substrate, the metallic film being removed after a multilayer wiring is formed. A soluble insulating film is formed on a metallic undercoat film on the substrate, and grooves are formed in the soluble insulating film, and wiring conductors are formed in the grooves, using either electroplating or both electroplating and electroless plating. Thereafter, the soluble insulating film and the metallic undercoat film are removed. Subsequently, an insoluble insulating film is formed at those locations from which the soluble insulating film and the metallic undercoat have been removed.

2 Claims, 11 Drawing Sheets

FIG. IA
PRIOR ART
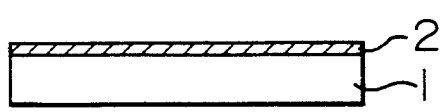
FIG. IB
PRIOR ART
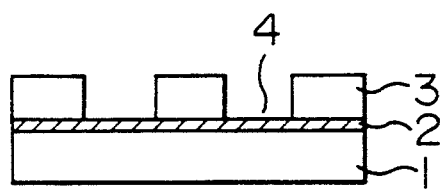
FIG. IC
PRIOR ART
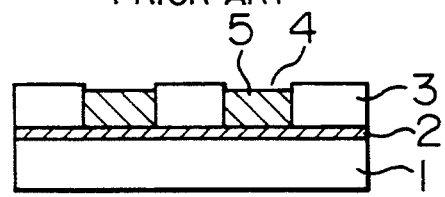
FIG. ID
PRIOR ART
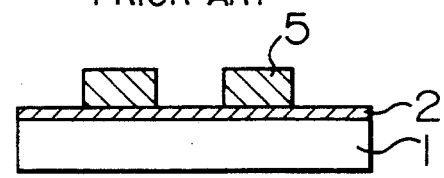
FIG. IE
PRIOR ART
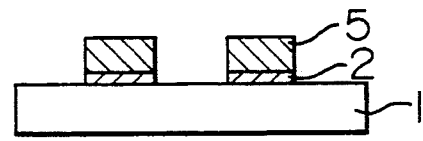
FIG. IF
PRIOR ART
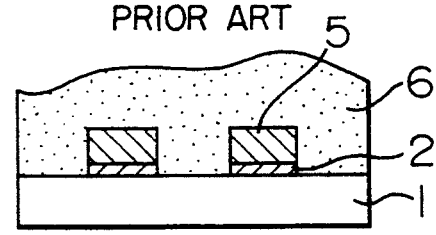
FIG. IG
PRIOR ART
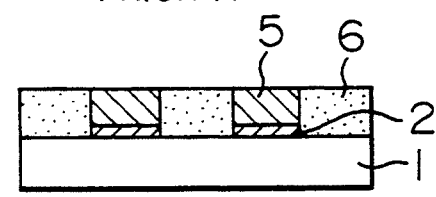

F I G. 10
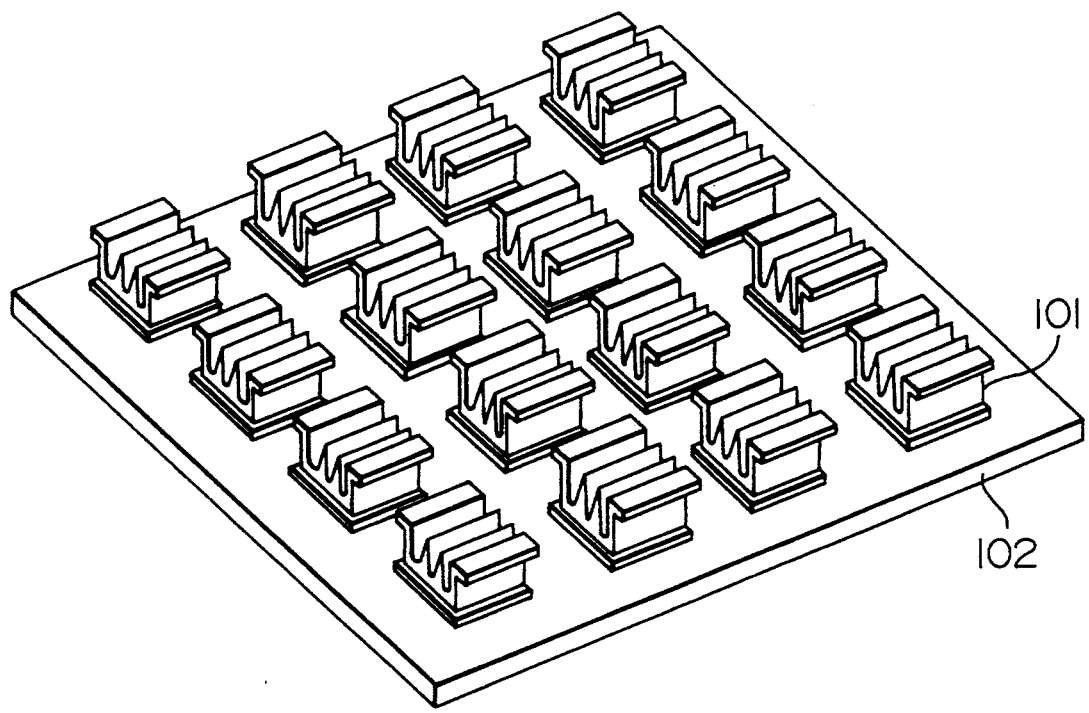

METHOD OF PRODUCING A THIN FILM MULTILAYER WIRING BOARD

FIELD OF THE INVENTION

This invention relates to a thin film multilayer wiring board for densely packaging highly-integrated LSIs, terminal resistors, capacitors and so on, and also relates to a method of producing such a wiring board, with the thin film multilayer wiring board being adapted to be used for a module, and is used as a wiring board of a computer.

BACKGROUND OF THE INVENTION

A typical conventional method of producing a thin film multilayer wiring board will be described with reference to steps (a) to (g) of the method as shown in FIGS. 1A–1C.

In the step (a), a metallic undercoat film 2 is formed on an upper surface of a substrate 1. This metallic undercoat film 2 is used as a plating electrode at a later stage.

In the step (b), a resist layer 3 is formed, and this layer is grooved into a configuration corresponding to a predetermined conductor pattern.

In the step (c), a conductor is filled in grooves 4 in the resist layer 3 by electroplating, thereby forming conductors 5 such as horizontally-extending wiring conductors, via hole conductors, through hole conductors and ground layer conductors.

In the step (d), the resist layer 3 is removed to expose the conductors 5.

In the step (e), the metallic undercoat film 2, except for those portions thereof disposed immediately beneath the conductors 5, is removed by etching.

In the step (f), an insoluble insulating layer 6 is formed on the upper surface of the substrate 1 so as to cover the conductors 5.

In the step (g), the insoluble insulating layer 6 is ground and polished so as to expose the upper surfaces of the conductors 5 and also to flatten the upper surface of the insoluble insulating layer 6.

With these steps (a) to (g), a thin film single-layer wiring board is formed, and then these steps (a) to (g) are repeated several times to form a thin film multilayer wiring board.

This conventional method is described in "Thin-film Conductors and Conductor Processes" on pages 710 to 714 (Item 9.6.2) of Microelectronics Packaging, edited by Rao R, Tummala and Eugene J. Rymaszewski, VAN NOSTRAND REINHOLD, and is described in detail particularly in FIGS. 9–21 on page 713.

In the above conventional method, however, when a thin film multilayer wiring board is to be produced, it is necessary to carry out the steps (a) to (g) illustrated in FIGS. 1A to 1G for forming each of the layers of the multilayer wiring board, and therefore the number of the steps involved is very large. Particularly, in the step (f), the insoluble insulating layer 6 is formed on the rugged portion defined by the substrate 1 and the conductors 5, and therefore the insoluble insulating layer 6 thus formed also becomes rugged. As a result, the step (g) of grinding and polishing the insoluble insulating layer 6 so as to flatten this layer is essential.

As later described, as the insoluble insulating layer, a polymeric material, such as polyimide, polyamide, polyamide-imide, polyester and polycarbonate may be employed. These materials become softened and viscous due to a temperature rise during the grinding and polishing operation, which results in a problem that the grinding and polishing are difficult and take much time. Another problem is that when the via conductors and so on are ground simultaneously with the grinding of the insoluble insulating layer, metal powder resulting therefrom is scattered, and adheres to the softened polymeric material. The metal powder may not be easily removed from the polymeric material by washing.

Therefore, there is a possibility that contaminants, such as powder of the polymer, may be present in each layer of the thin film multilayer wiring board. Therefore, in order to enhance the reliability, the step of washing away the contanimants, as well as the step of inspecting an electrical defect, are needed in addition to the above steps (a) to (g). Moreover, when an electrically-defective product (the thin film multilayer wiring board having a defect at least in one layer thereof) is found in this inspection step, an additional step must be carried out in order to reuse such an electrically-defective product, and it is practically difficult to remove the several $\mu$m-thick thin film layer at the defective portion. Consequently, a considerable number of defective products have been produced, and the yield rate was inevitably low.

Further, in the thin film multilayer wiring board produced by the above method, the insoluble insulating layer 6 is coated on the rugged portion defined by the substrate 1 and the conductors 5, and therefore a liquid material must be used for forming the insoluble insulating layer 6. When the liquid material is to be cured or set into a solid by a heat treatment, stresses of different values develop due to a large difference in thermal expansion coefficient between the substrate 1, the metallic undercoat film 2, the conductors 5 and etc. These stresses have caused warping of the thin film multilayer wiring board.

As described above, the above conventional method of producing the thin film multilayer wiring board suffers from the problems with the mass productivity, the reliability and the yield rate, and besides there is encountered another problem that warping is present in the resultant thin film multilayer wiring board.

SUMMARY OF THE INVENTION

With the above problems of the prior art (that is, a low mass-productivity due to an increased number of the process steps, a low reliability and a low yield rate due to the generation of contaminants during the grinding and polishing operation) in view, it is an object of this invention to provide a method of producing a thin film multilayer wiring board which is excellent in mass-productivity, reliability and yield rate.

With the warp problem of the prior art in view, it is another object of the invention to provide a thin film multilayer wiring board which is less warped.

A thin film multilayer wiring board-producing method of the present invention is performed by the following processes (A) to (C). With respect to the formation of each layer, the grinding and polishing for flattening an insoluble insulating film are not necessary, and also the formation and removal of a resist is not necessary except for the first layer. Further, the removal of a metallic undercoat film is not necessary except for the first layer. Therefore, the mass productivity, the reliability and the yield are excellent.

(A) A thin film multilayer wiring board-producing method is characterized by the steps of:
(1) forming a first metallic undercoat film on a substrate, then forming a soluble insulating film on the metallic undercoat film, and forming grooves in the soluble insulating film, and then filling a conductor in the grooves by electroplating, thereby forming a first layer;
(2) subsequently forming an insoluble insulating film on the first layer or on a horizontal metallic undercoat film formed on the first layer, and forming grooves in the insoluble insulating film, and then filling a conductor in the grooves by the use of electroplating or both electroless plating and electroplating, thereby forming a second layer on the first layer; and
(3) subsequently removing the soluble insulating film and the first metallic undercoat film, and forming an insoluble insulating film at those portions from which the soluble insulating film and the first metallic undercoat film have been removed.

(B) A thin film multilayer wiring board-producing method is characterized by the steps of:
(1) forming a first metallic undercoat film on a substrate, then forming a soluble insulating film on this metallic undercoat film, and forming grooves in the soluble insulating film, then filling a conductor in the grooves by electroplating, then removing the soluble insulating film, and then forming a metallic film, capable of selective etching with respect to the conductor, at that portion from which the soluble insulating film has been removed, thereby forming a first layer;
(2) subsequently forming an insoluble insulating film on the first layer or on a horizontal metallic undercoat film formed on the first layer, and forming grooves in the insoluble insulating film, and then filling a conductor in the grooves by the use of electroplating or both electroless plating and electroplating, thereby forming a second layer on the first layer; and
(3) subsequently removing the metallic film, capable of selective etching with respect to the conductor, and the first metallic undercoat film, and then forming an insoluble insulating film at those portions from which the metallic film and the first metallic undercoat film have been removed.

(C) A thin film multilayer wiring board-producing method is characterized by the steps of:
(1) forming a first metallic film on a lower surface of a substrate, and forming an insoluble insulating film on an upper surface of the substrate or on a horizontal metallic undercoat film formed on the upper surface of the substrate, then forming grooves in the insoluble insulating film, and then filling a conductor in the grooves by the use of electroplating or both electroless plating and electroplating, thereby forming a first layer on the upper side of the substrate;
(2) subsequently forming an insoluble insulating film on the first layer or on a horizontal metallic undercoat film formed on the first layer, and forming grooves in the insoluble insulating film, and then filling a conductor in the grooves by the use of electroplating or both electroless plating and electroplating, thereby forming a second layer on the first layer;
(3) subsequently removing the first metallic film.

One preferred form of the thin film multilayer wiring board of the present invention is described in Item (D) below. A liquid material is beforehand cured by a heat treatment into a solid form to provide a film material, and this film material is used as an insoluble insulating film. Therefore, no undesirable stresses of different values will develop due to a large difference in thermal expansion coefficient between a substrate, a metallic undercoat film and conductors. As a result, the thin film multilayer wiring board extremely reduced in warp can be obtained.

(D) A thin film wiring board comprising one or more layers formed on a substrate, with each of the layers comprising a conductor, an insoluble insulating film, and optionally a metallic undercoat film provided beneath the conductor, and the insoluble insulating film being an insoluble film material adhesively bonded.

BRIEF DESCRIPTION OF THE DRAWINGS

FIGS. 1A–1G are cross-sectional views showing a sequence of steps of a conventional method of producing a thin film multilayer wiring board;

FIG. 10 is a perspective view of a logic package of a computer, provided in accordance with the present invention.

DETAILED DESCRIPTION OF THE PREFERRED EMBODIMENTS

Figure 2:
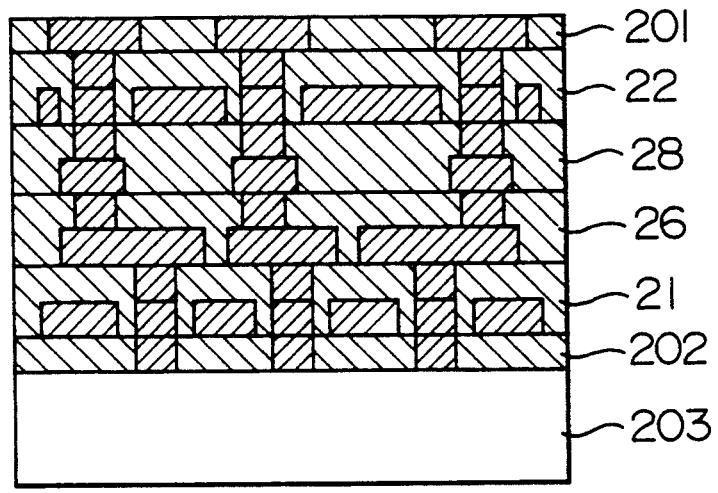
FIG. 2 is a cross-sectional view showing one set of signal layers.

The inventors of the present invention have made an extensive study, noting that in the above-mentioned conventional method of producing the thin film multilayer wiring board, particularly since in the step (f), the insoluble insulating film 6 is formed on the rugged portion defined by the substrate and the conductors 5 with the result that the insoluble insulating film 6 thus formed is rugged, the step (g) of grinding and polishing the insoluble insulating layer 6 to flatten the same is essential, and that this extremely lowers the mass-productivity, the reliability and the yield rate. As a result of the extensive study, the inventors of the present invention have noted that by forming an insulating film on a flat portion, the insulating film thus formed is also flat, and based on this finding, the inventors have found a method of producing a thin film multilayer wiring board according to the present invention. A thin film multilayer wiring board is produced by any one of the following methods (A) to (C) of the present invention. To further increase the number of the layers, in the method (A), the step (A)(2) is further repeated one or more times. Similarly, in the method (B), the step (B)(2) is further repeated one or more times. Similarly, in the method (C), the step (C)(2) is further repeated one or more times. With the methods (A) to (C), the grinding and polishing for flattening the insoluble insulating film become unnecessary with respect to the formation of any layer, and besides the formation and removal of a resist become unnecessary with respect to the formation of other layers than the first layer, and further the removal of a metallic undercoat film becomes unnecessary with respect to the formation of other layers than the first layer. Therefore, the mass-productivity, the reliability and the yield rate are excellent.

(A) A thin film multilayer wiring board-producing method is characterized by the steps of:
(1) forming a first metallic undercoat film on a substrate, then forming a soluble insulating film on the metallic undercoat film, and forming grooves in the soluble insulating film, and then filling a conductor in the grooves by electroplating, thereby forming a first layer;
(2) subsequently forming an insoluble insulating film on the first layer or on a horizontal metallic undercoat film formed on the first layer, and forming grooves the insoluble insulating film, and then filling a conductor in the grooves by the use of electroplating or both electroless plating and electroplating, thereby forming a second layer on the first layer; and
(3) subsequently removing the soluble insulating film and the first metallic undercoat film, and forming an insoluble insulating film at those portions from which the soluble insulating film and the first metallic undercoat film have been removed. (B) A thin film multilayer wiring board-producing method is characterized by the steps of:
(1) forming a first metallic undercoat film on a substrate, then forming a soluble insulating film on this metallic undercoat film, and forming grooves in the soluble insulating film, then filling a conductor in the grooves by electroplating, then removing the soluble insulating film, and then forming a metallic film, capable of selective etching with respect to the conductor, at that portion from which the soluble insulating film has been removed, thereby forming a first layer;
(2) subsequently forming an insoluble insulating film on the first layer or on a horizontal metallic undercoat film formed on the first layer, and forming grooves in the insoluble insulating film, and then filling a conductor in the grooves by the use of electroplating or both electroless plating and electroplating, thereby forming a second layer on the first layer; and
(3) subsequently removing the metallic film, capable of selective etching with respect to the conductor, and the first metallic undercoat film, and then forming an insoluble insulating film at those portions from which the metallic film and the first metallic undercoat film have been removed.

(C) A thin film multilayer wiring board-producing method is characterized by the steps of:
(1) forming a first metallic film on a lower surface of a substrate, and forming an insoluble insulating film on an upper surface of the substrate or on a horizontal metallic undercoat film formed on the upper surface of the substrate, then forming grooves in the insoluble insulating film, and then filling a conductor in the grooves by the use of electroplating or both electroless plating and electroplating, thereby forming a first layer on the upper side of the substrate;
(2) subsequently forming an insoluble insulating film on the first layer or on a horizontal metallic undercoat film formed on the first layer, and forming grooves in the insoluble insulating film, and then filling a conductor in the grooves by the use of electroplating or both electroless plating and electroplating, thereby forming a second layer on the first layer;
(3) subsequently removing the first metallic film.

In the thin film multilayer wiring board produced by the above conventional method, the insoluble insulating layer 6 is formed on the rugged portion defined by the substrate 1 and the conductors 5, and therefore a liquid material must be used for forming the insoluble insulating film 6. When the liquid material is to be cured or set into a solid by a heat treatment, stresses of different values develop due to a large difference in thermal expansion coefficient between the substrate 1, the metallic undercoat film 2, the conductors 5 and etc. This has resulted in a warp of the thin film multilayer wiring board. The inventors of the present invention have noted this point, and have made an extensive study, and have found that such a liquid material does not need to be used to form the insulating film on the flat portion, and that a film-like insulating material (film-like material) can be used. Based on this finding, the inventors of the present invention have invented the thin film multilayer wiring board of the present invention. The thin film multilayer wiring board of the present invention has any one of the following constructions (D) to (F). With such construction of the present invention, a liquid material does not need to be used for forming the insulating film with respect to the formation of all layers, and a film-like insulating material to be adhesively bonded can be used. Therefore, there can be obtained the thin film multilayer wiring board subjected to less warp.

(D) A thin film wiring board comprising one or more layers formed on a substrate, each of the layers comprising a conductor, an insoluble insulating film, and optionally a metallic undercoat film provided beneath the conductor, and the insoluble insulating film being an insoluble film material adhesively bonded.

(E) A thin film wiring board as defined in the above Item (D) wherein the film material consists of at least one selected from the group consisting of a polyimide film, a polyamide film, a polyamide-imide film, a polyester film and a polycarbonate film.

(F) A thin film wiring board as defined in the above Item (D) wherein the metallic undercoat film consists of at least one material selected from the group consisting of Cr, Cu, Ti, Zn, Sn, Co, Fe, Ni, Rh and In.

Next, the above methods (A) to (C) of producing the thin film multilayer wiring board according to the present invention, as well as the above constructions (D) to (F), will be described in detail.

In the conventional thin film multilayer wiring board-producing method, one major reason why the formation and removal of the photoresist are carried out with respect to each layer is that the metallic undercoat film serving as the electrode of the electroplating must be formed and removed with respect to each layer. Therefore, first, attention was directed to the steps of formation and removal of the metallic undercoat film serving as the electrode of the electroplating, and an attempt has been made to rationalize these two steps in order to rationalize the steps of formation and removal of the photoresist.

If the wiring conductors of the thin film multilayer wiring board are constituted only by through hole conductors extending from the uppermost layer to the lowermost layer, the lengths of all the through hole conductors are the same, and those portions at the same level or height are at the same electrical potential when carrying out the electroplating. Therefore, in this case, it is necessary to provide the metallic undercoat film only at the lowermost layer, and there is no need to provide it at all of the layers.

Figure 3:
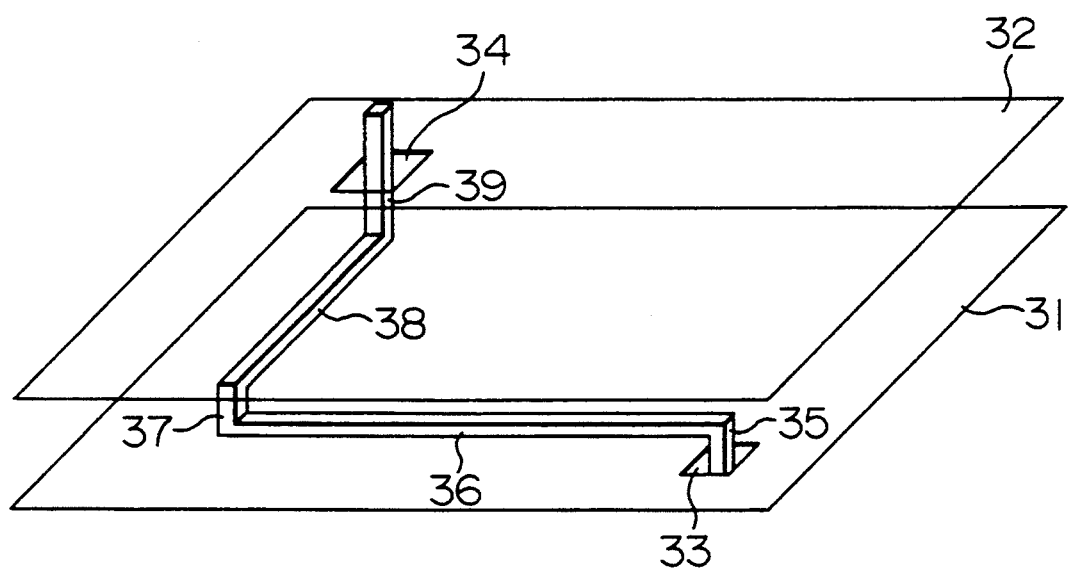
FIG. 3 is a schematic and perspective view showing a basic construction of a wiring conductor.

Actually, however, the wirings, provided in the interior of the thin film multilayer wiring board, include not only the through hole conductors of the same length, but also horizontally-extending X-direction and Y-direction wirings as well as ground layer conductors electrically interrupted from via hole conductors, as shown in FIG. 3. In order to form these conductors by electroplating, it is necessary to provide the metallic undercoat film (serving as the electrode) under each of them. This is the reason why the metallic undercoat film must be provided at each layer in the conventional thin film multilayer wiring board.

Although its internal structure may be slightly varied or modified, a thin film multilayer wiring board can be produced by repeatedly forming this one set of signal layers. One set of signal layers of FIG. 2 comprises a surface layer 201, an upper ground layer 22, an X-direction wiring 28, a Y-direction wiring 26, a lower ground layer 21, a matching layer 202, and a thick film substrate 203. The wiring conductors of the upper ground layer 22, the X-direction wiring 28, the Y-direction wiring 26 and the lower ground layer 21 will be described in detail with reference to FIG. 3. A via or through-hole wiring 35, electrically interrupted from the lower ground layer 31, is disposed at the lowermost ground layer 31, and extends through a hole 33 formed through the lower ground layer 31, and a horizontally-extending Y-direction wiring 36 is disposed at the upper layer adjacent thereto, and a via wiring 37 extends upwardly from the Y-direction wiring 36 to a horizontally-extending X-direction wiring 38, and a via or through-hole wiring 39, extends upwardly from the X-direction wiring 38. The wiring 39 extends through a hole 34 formed through the upper ground layer 32 from which the wiring 39 is electrically interrupted.

When an LSI and a power source are not connected to the thin film multilayer wiring board, the wiring conductors provided in the interior of this wiring board are not electrically connected to one another, and are independent of one another. Therefore, in order that the wiring conductors at each layer can be formed at a time by electroplating, the metallic undercoat film serving as the electrode must be provided over the entire area of the substrate, because any portions of this layer need to have the same potential. After the formation of the conductors, the wirings must be electrically interrupted from one another, and therefore the metallic undercoat film except for those portions thereof disposed immediately beneath the wiring conductors must be removed by etching. In order to remove the metallic undercoat film by etching, it is necessary to remove the photoresist covering it. This is the reason why in the formation of the wiring conductors in the conventional method, instead of an insulating film which can not be easily removed by dissolving, the photoresist which can be removed by dissolving is used as the polymer in which the grooves are formed so as to form the wiring conductors by electroplating.

In the present invention, as shown in FIG. 2, a photoresist is not used as the polymer in which the grooves are formed so as to form the wiring conductors, and instead the permanent insulating film is used. Therefore, the step of forming the photoresist and the step of removing it are omitted. This means that the removal of the metallic undercoat film by etching after the removal of the photoresist is also unnecessary except for the metallic undercoat film of the lowermost layer over the entire surface of the substrate.

However, this does not means that the metallic undercoat film is unnecessary except for the lowermost layer, and so long as the wiring conductors are formed by electroplating, the metallic undercoat film is still necessary to provide the electrodes disposed immediately beneath the X-direction and Y-direction wiring conductors and the ground layer conductor. Thus, it is to be noted that it is not necessary to form the metallic undercoat film over the entire area of the substrate in such a manner as to extend between the wiring conductors.

When the metallic undercoat film is to be formed over the entire surface of the substrate by electroplating, the only requirement to be satisfied is that the metallic undercoat film should have the same potential at any portion of the substrate, and therefore usually, the metallic undercoat film is formed into a thickness of not more than 1 $\mu$m. In the present invention, however, as the metallic undercoat film for the X-direction and Y-direction wiring conductors is away from the metallic undercoat film of the lowermost layer, the electrical resistivity of the metallic undercoat film to be disposed immediately beneath the X-direction and Y-direction wiring conductors increases. Therefore, the height of the conductor precipitated by electroplating becomes gradually smaller, which results in a problem that a large difference in height between both ends of the wiring conductor develops. In view of this, in the present invention, in order to decrease the electrical resistivity of the metallic undercoat film formed in accordance of the areas of the lower surfaces of the X-direction and Y-direction wiring conductors, the film thickness is increased. One means for achieving this is to increase the thickness of the metallic undercoat film from the beginning. Another means is to first form a metallic undercoat film of not more than 1 $\mu$m thickness in the conventional manner and then to increase its thickness by electroless plating.

Preferably, variations in the height of the wiring conductor should be not more than 10%. To meet this requirement, the inventors of the present invention have confirmed through experiments that the resistivity of the metallic undercoat film (disposed immediately beneath the X-direction and Y-direction wiring conductors) between both ends of the wiring should be less than several tens of $\Omega$. For example, if the metallic undercoat film of copper has a thickness of 1 $\mu$m, a width of 30 $\mu$m and a length of 200 mm, the resistivity of this metallic undercoat film is about 110 $\Omega$. Then, as shown in FIGS. 4A-4J, when by electroless plating, copper is precipitated about 1 to 5 $\mu$m in the groove formed in the insulating film (20 $\mu$m in width) formed on this metallic undercoat film, the resistivity is reduced to 70 to 26 $\Omega$ and variations in the thickness of the wiring conductor formed by electroplating can be kept to not more than ±10%.

Presuming that the wiring conductor of copper has a cross-sectional area of a square shape (20 $\mu$m×20 $\mu$m), and that the thickness produced by the above-mentioned electroless plating is 5 $\mu$m, when one set of signal layers, comprising the via hole layer, the X-direction wiring layer, the via hole layer, the Y-direction wiring layer and the via hole layer, is to be formed, the metallic undercoat film, serving as the electrode, must be provided at the lowermost layer over the entire surface of the substrate. However, in this case, the metallic undercoat films at those layers above the lowermost layer need only to be formed at those portions immediately beneath the conductors, and do not need to be formed over the entire area of the substrate. Therefore, except for the metallic undercoat film at the lowermost layer, the metallic undercoat films at those layers above the lowermost layer do not need to be removed after the formation of the thin film multilayer construction.

Instead of using the electroless plating as described above, the thickness of the metallic undercoat film may be increased using a dry process such as vapor deposition, sputtering and ion-plating.

Even with the method of the present invention, when more than several wiring layers are laminated, variations in the thickness of the wiring conductor precipitated by electroplating may sometimes become more than 10%, which is not acceptable. In such a case, it is necessary to provide the metallic undercoat film over the entire area of the substrate so as to obtain the equipotential for the electroplating. In this case, the metallic undercoat film must be etched and removed after the predetermined multilayer process is finished. Therefore, although the metallic undercoat film is provided at the lower layer, the layer at which the metallic undercoat film is formed is not always limited to the lowermost layer.

In the conventional method, the photoresist is coated, and the grooves are formed, and the wiring conductor is filled in the grooves by electroplating, and thereafter the photoresist is dissolved and removed by a solvent. The steps of the formation and removal of the photoresist are needed so as to etch and remove the metallic undercoat film formed therebelow over the entire area of the substrate. Therefore, it is unnecessary to remove the metallic undercoat film by etching after the formation of the wiring conductor, except at that layer providing the common electrode of the plating, since the photoresist does not need to be used as the plating resist, and the permanent (insoluble) insulating film, which remains from the beginning to the end of the process, can be used. Namely, a disadvantageous treatment for replacing the photoresist by the permanent insulating film can be omitted. And besides, the step of flattening the rugged portion of the permanent insulating film by grinding and polishing in the conventional method is omitted.

The insulating film at the wiring layer (1 to 200 $\mu$m) having the metallic undercoat film over the entire area of the substrate is composed of a high thermal-resistant, high glass transition temperature polymer which can be dissolved and removed by a solvent such as an ordinary organic solvent, an alkali aqueous solution, and an organic base (e.g., hydrazine hydrate). The insulating film laminated above this wiring layer should not be dissolved by the above solvent, and should not be adversely affected by this solvent during the dissolving of the soluble insulating film. The soluble insulating film is required to withstand the influence of the curing of the upper insoluble insulating film and its curing temperature, and should not be deteriorated by these factors.

After the soluble insulating film is dissolved and removed by the solvent, an etchant such as cerium (IV) ammonium sulfate dihydrate is caused to intrude into the space formed as a result of removal of this soluble insulating film, thereby removing the metallic undercoat film by etching.

As will be readily appreciated, the reason for the use of the soluble insulating film as described above is to facilitate the etching removal of the metallic undercoat film (over the entire area of the substrate) after the formation of the thin film multilayer construction. Any material other than the soluble insulating film can be used so long as it produces similar effects. One example of such material is a metallic material capable of selective etching, which is different in kind from the wiring conductor. If the wiring conductor is made of copper, zinc capable of selective etching with respect to it is selected. With this method, an electrically-isolated wiring, that is, a floating pattern conductor, can be formed at a desired layer.

The space, formed as a result of removing the soluble insulating film and the metallic undercoat film, produces the effect of increasing the signal transfer speed because of a low dielectric constant; however, an insulating treatment is applied to this space so that contaminants will not intrude into this space. This insulating treatment may be carried out by pouring varnish. The varnish to be used may be either of the solvent type and the non-solvent type.

As described above, the multilayer wiring construction can be produced by sequentially forming a plurality of layers by electroplating, and in this manner a module board required for a computer or the like can be produced.

The various materials used in the thin film multilayer wiring board-producing method of the present invention will now be described.

As the insoluble permanent insulating film, there can be used polyimide, polyamide, polyamide-imide, a cyanate ester resin, an epoxy resin, and an isocyanate-oxazoridone resin which have a high thermal resistance (capable of withstanding the process temperature during the connection and production of the multilayer construction), a high glass transition temperature and a high adhesive property. However, the insoluble insulating film is not limited to these materials.

Polyimide to be used may be either of the photosensitive type or the non-photosensitive type, and may not be limited to a specific chemical structure. However, the polyimide should preferably have a high thermal decomposition temperature (not less than 200° C. and preferably not less than 280° C.), a high glass transition temperature (not less than 200° C. and preferably 280° C.) and a low thermal .expansion coefficient (not more than 20 ppm°C$^{-1}$). Particularly, the type of polyimide, which contains, as an essential component, anhydride having biphenyl moiety or terphenyl moiety, or a diamine having biphenyl moiety or terphenyl moiety, is most preferred.

Polyimide is excellent in all of the above physical properties, but poses some problems. More specifically, the curing temperature must be finally as high as 350° to 400° C. Since it is supplied in the form of a solvent varnish, it is necessary to volatilize the solvent when cured, and therefore pin holes inevitably develop in the insulating film. Polyimide can not be coated into a desired thickness (for example, 20 μm) of the wiring layer at a time, and therefore it must be coated two to three times, and the time required for the curing is more than several hours.

On the other hand, an epoxy resin can be supplied in a non-solvent condition (that is, this resin is not dissolved in a solvent), and a coating without pin holes can be formed. Besides the epoxy resin has a curing temperature of 150° to 200° C. which is much lower than that of polyimide, and therefore the curing time is short. Although there are these advantages, the epoxy resin is inferior in physical properties to the polyimide. More specifically, the conventional epoxy resin has a low thermal decomposition temperature and a low glass transition temperature both of which are less than 200° C. and a high thermal expansion coefficient. Under these circumstances, the inventors of the present invention have made an extensive study, and have found the following facts. A cured substance of an epoxy compound which contains a curing agent having diamino diphenyl methane, diamino diphenyl sulfone, biphenyl moiety or terphenyl moiety, and naphthalene moiety, as well as a cured substance of an epoxy resin having imide moiety, has a thermal decomposition temperature of not less than 300° C. and a glass transition temperature of not less than 300° C., and these substances well satisfy the required thermal resistance of a module board for a computer. The inventors of the present invention also have found the epoxy resin which is lower in thermal expansion coefficient than that of the conventional type, and this epoxy resin, when cooperating with a copper conductor to form a composite structure, is much lowered in thermal stress. Further, this epoxy resin is several times higher in adhesive strength than polyimide. Therefore, depending on the purpose of use of the module, the epoxy resin is suitably used as the insulating film of the thin film multilayer wiring board because of its shortened production time, the structure without pin holes and the high adhesive properties. Particularly when the substrate is thick, much time is required for the temperature rise and the heat radiation for cooling, because such a substrate has a large thermal capacity. In such a case, the non-solvent type epoxy resin which can be cured at low temperatures is very suitable. It is not always necessary to use the permanent insulating film and the soluble insulating film in the form of varnish, and they can be applied to the board of the present invention in the form of a film-like material made of polyimide, polyamide, polyamide-imide, polyester, polycarbonate or the like. In this case, particularly, there is an advantage that there can be selected a suitable permanent insulating film well matching the board of the invention in various properties such as the thermal decomposition temperature, the glass transition temperature and the thermal expansion coefficient. One example of such film material is a polyimide film which contains biphenyl moiety or terphenyl moiety in its molecule, and has a high thermal resistance, a high glass transition temperature and a low thermal expansion coefficient. Usually, the above film-like material can not be bonded to the substrate, and therefore is used in the form of a film with an adhesive of acrylic resin or epoxy resin, or in the form of a B-stage film. Before laminating the layers, grooves for filling the conductor therein may be formed in this film-like insulating material at a place off the production line, and also the metallic undercoat film may be formed. This is very effective in reducing the time of production of the thin film multilayer wiring board.

The soluble insulting film is not limited to the above-mentioned materials, and it may be formed by chemically modifying the above permanent insulating film to impart a solubility thereto. For example, a high molecular-weight phenol novolac and a phenoxy resin may be used.

The grooves, in which the conductor is to be filled by plating so as to form the wiring conductors of the via hole layers (the through hole layers), the X-direction wiring layer, the Y-direction wiring layer and the ground layer, must be formed in the above permanent insulating film. The grooves can be formed by a laser process, a plasm process or a photolithograpy, but can be formed by any other suitable process.

The metallic undercoat film has electrical conductivity so that it can serve as the electrode for the electroplating or as the undercoat for the electroless plating. For example, the metallic undercoat film can be formed using vapor deposition, sputtering, ion plating, electroplating and electroless plating either alone or in combination. In this case, for example, the metallic undercoat film is constituted by a metal layer or multilayer, such as Cr/Cu/Cr, Ti/Cu/Ti, Ti, Cu, Zn, Sn, Co, Fe, Ni, Ni/Cu, Rh, and In.

As the wiring conductor metal, conventional metal with a low resistivity, such as Au, Ag and Cu, can be used.

The present invention will now be described in detail by way of the following Examples.

EXAMPLE 1

FIGS. 4A–4J shows the sequence of steps of a method of producing a thin film multilayer wiring board according to the present invention. In FIGS. 4A–4J, a conductor is filled in grooves by electroplating.

Figure 4A:
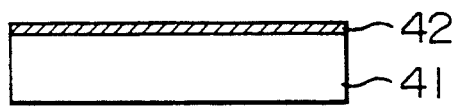
FIGS. 4A–4J are cross-sectional views of the sequence of steps of a method of producing a thin film multilayer wiring board according to the present invention.

In FIG. 4A, a metallic undercoat film 42 of Cr/Cu having a thickness of 0.8 μm is formed on a ceramics substrate 41 (which may have a multilayer wiring).

Figure 4B:
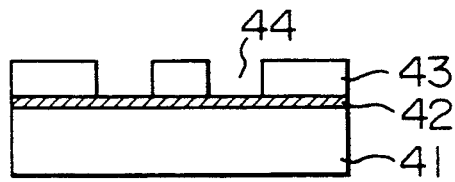

In FIG. 4B, a soluble polyimide insulating film 43 having a thickness of 30 μm is coated onto the metallic undercoat film 42 by a spinner, and is finally baked at 350° C. Then, an aluminum film subjected to patterning is formed as a mask on the polyimide film, and grooves 44 are formed in this film by an oxygen plasma, so that the metallic undercoat film 42 is exposed at the bottoms of the grooves 44.

Figure 4C:
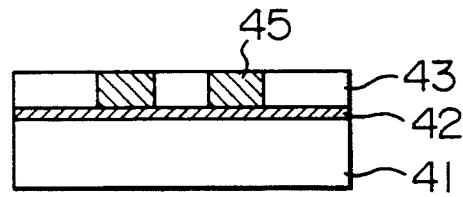

In FIG. 4C, the metallic undercoat film 42 is dipped in an aqueous solution of copper sulfate, and copper is precipitated and filled in the grooves 44 by electroplating, using the metallic undercoat film 42 as an electrode, thereby forming via hole wiring conductors 45.

Figure 4D:
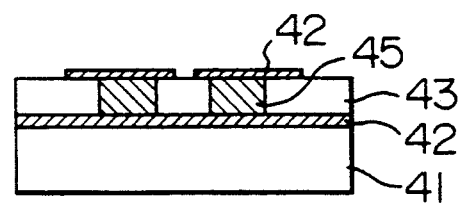

In FIG. 4D, a metallic undercoat film 42 of Cr/Cu having a thickness of 0.8 μm is formed by sputtering at those portions disposed immediately beneath an X-layer wiring to be formed at an upper layer.

Figure 4E:
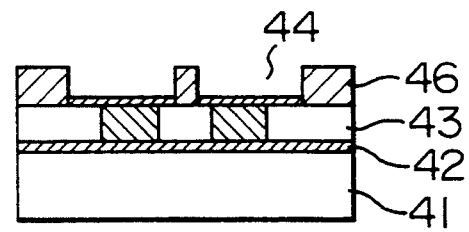

In FIG. 4E, an insoluble polyimide insulating film (permanent insulating film) 46 having a thickness of 20 μm is formed on the upper surface. Then, an aluminum film subjected to patterning is formed as a mask on this polyimide film, and grooves 44 are formed in the polyimide film by an oxygen plasma, so that the metallic undercoat film are exposed at the bottoms of the grooves 44.

Figure 4F:
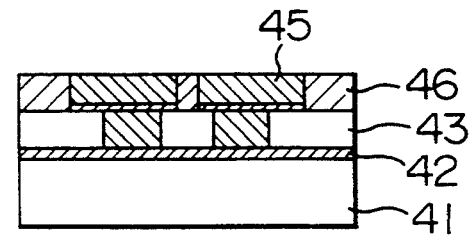

In FIG. 4F, since the metallic undercoat film 42 (which is connected to the via hole wiring conductors 45 at the bottoms of the grooves 44), having a pattern corresponding to the pattern of the X-layer wiring, has been exposed, this is dipped in an aqueous solution of copper sulfate, and copper is precipitated and filled in the grooves 44 by electroplating, using the metallic undercoat film as an electrode, thereby forming X-layer wiring conductors 45.

Figure 4G:
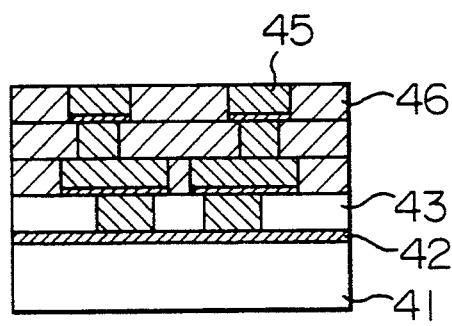

In FIG. 4G, according to the procedure of formation of the X-layer wiring, a via hole layer, a Y-layer, a via hole layer, a ground layer and a via hole layer are sequentially formed in a laminated manner.

Figure 4H:
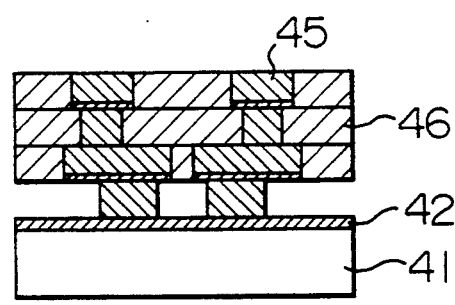

In FIG. 4H, the soluble polyimide insulating film 43 is dissolved and removed by a solvent.

Figure 4I:
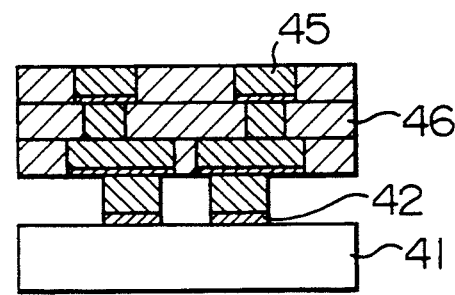

In FIG. 4I, the metallic undercoat film 42 at the lowermost layer except for those portions thereof disposed immediately beneath the via hole conductors is etched and removed by cerium (IV) ammonium sulfate dihydrate.

Figure 4J:
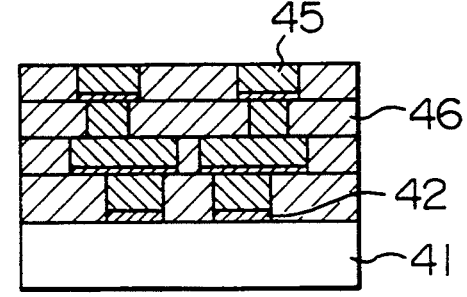

In FIG. 4J, the spaces, formed as a result of removing the soluble polyimide insulating film 43 by dissolving and as a result of removing the metallic undercoat film 42 by etching, are treated with polyimide varnish to insulatively cover the via hole copper.

With the above steps, one set of signal layers have been formed. If necessary, one or more sets of signal layers can be further formed on this first set of signal layers by repeating the steps of FIGS. 4B to 4J.

EXAMPLE 2

In this Example, as in Example 1, a thin film multilayer wiring board is produced according to the method shown in FIGS. 4A-4J. However, in Example 1, the soluble and insoluble insulating films are formed by a liquid material whereas in this Example, film-like materials are used as the insulating films.

In FIG. 4A, a metallic undercoat film 42 of Cr/Cu having a thickness of 0.6 μm is formed by sputtering on a ceramics substrate 41 (which may have a multilayer wiring).

In FIG. 4B, a soluble polyimide film (25 μm thick) 43 with an adhesive is attached to the metallic undercoat film 42, and cured and adhesively bonded thereto. Then, grooves 44, arranged in a pattern corresponding to a via hole pattern, are formed in the polyimide film by ekishima laser through a mask, so that the metallic undercoat film 42 is exposed at the bottoms of the groove 44.

In FIG. 4C, the metallic undercoat film 42 is dipped in an aqueous solution of copper sulfate, and copper is precipitated and filled in the grooves 44 by electroplating, using the metallic undercoat film 42 as an electrode, thereby forming via hole wiring conductors 45.

In FIG. 4D, a metallic undercoat film 42 of Cr/Cu having a thickness of 20 μm is formed by sputtering at those portions disposed immediately beneath an X-layer wiring to be formed at an upper layer, the metallic undercoat film 42 being several μm larger in width than the X-layer wiring.

In FIG. 4E, an insoluble polyimide film (insulating film) (20 μm thick) with an adhesive is bonded to the upper surface, and is cured at 150° C. for several minutes. Then, grooves 44, arranged in a pattern corresponding to an X-layer wiring pattern, are formed in the polyimide film by ekishima laser through a mask, so that the metallic undercoat film 42 is exposed at the bottoms of the holes 44.

In FIG. 4F, since the Cr/Cu metallic undercoat film 42 (which is connected to the via hole wiring conductors 45 at the bottoms of the grooves 44), having a pattern corresponding to the pattern of the X-layer wiring, has been exposed, this is dipped in an aqueous solution of copper sulfate, and copper is precipitated and filled in the grooves 44 by electroplating, using the metallic undercoat film as an electrode, thereby forming X-layer wiring conductors 45.

In FIG. 4G, according to the procedure of formation of the X-layer wiring, a via hole layer, a Y-layer, a via hole layer, a ground layer and a via hole layer are sequentially formed in a laminated manner.

In FIG. 4H, the soluble polyimide insulating film 43 is dissolved and removed by a solvent.

In FIG. 4I, the metallic undercoat film 42 at the lowermost layer except for those portions thereof disposed immediately beneath the via hole conductors is etched and removed by cerium (IV) ammonium sulfate dihydrate.

In FIG. 4J, the spaces, formed as a result of removing the soluble polyimide insulating film 43 by dissolving and as a result of removing the metallic undercoat film 42 by etching, are treated with polyimide varnish to insulatively cover the via hole copper.

With the above steps, one set of signal layers have been formed. If necessary, one or more sets of signal layers can be further formed on this first set of signal layers by repeating the steps of FIGS. 4B to 4J.

EXAMPLE 3

FIGS. 5A-5K shows the sequence of steps of a method of producing a thin film multilayer wiring board according to the present invention. In FIGS. 5A-5K, a conductor is filled in grooves by electroplating or a combination of electroless plating and electroplating.

Figure 5A:
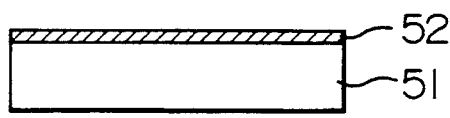
FIGS. 5A–5K are cross-sectional views of a sequence of steps of a modified method of producing a thin film multilayer wiring board according to the present invention.

In FIG. 5A, a metallic undercoat film 52 of Cr/Cu having a thickness of 0.8 μm is formed by sputtering on a ceramics substrate 51 (which may have a multilayer wiring).

Figure 5B:
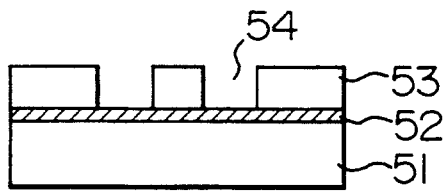

In FIG. 5B, a soluble polyimide insulating film 53 having a thickness of 30 μm is coated on the metallic undercoat film 52 by a spinner, and is finally baked at 350° C. Then, an aluminum film subjected to patterning is formed as a mask on the polyimide film, and grooves 54 are formed in the polyimide film by an oxygen plasma, so that the metallic undercoat film 52 is exposed at the bottoms of the grooves 54.

Figure 5C:
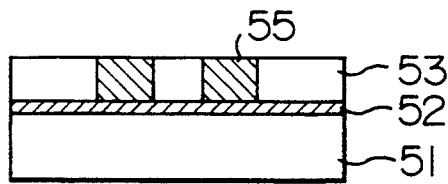

In FIG. 5C, the metallic undercoat film 52 is dipped in an aqueous solution of copper sulfate, and copper is precipitated and filled in the grooves 54 by electroplating, using the metallic undercoat film 52 as an electrode, thereby forming via hole wiring conductors 55.

Figure 5D:
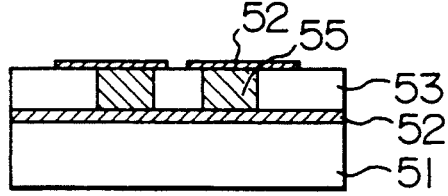

In FIG. 5D, a metallic undercoat film 52 of Cr/Cu having a thickness of 0.8 μm is formed by sputtering at those portions disposed immediately beneath an X-layer wiring to be formed at an upper layer.

Figure 5E:
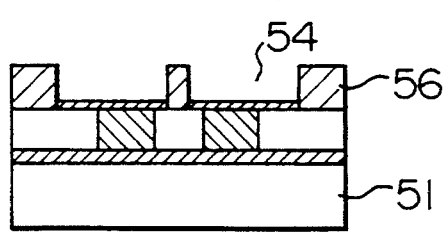

In FIG. 5E, an insoluble polyimide insulating film (permanent insulating film) 56 having a thickness of 20 μm is formed on the upper surface. Then, an aluminum film subjected to patterning is formed as a mask on the polyimide film, and grooves 54 are formed in the polyimide film by an oxygen plasma, so that the metallic undercoat film is exposed at the bottoms of the grooves 54.

Figure 5F:
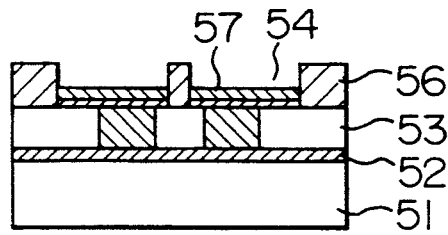

In FIG. 5F, copper is filled in the grooves 54 by electroless plating to form electroless-plating conductors 57 having a thickness of 5 μm.

Figure 5G:
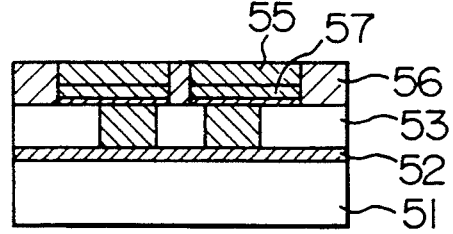

In FIG. 5G, electroplating is further carried out using the metallic undercoat film 52 of Cr/Cu (which is connected to the via hole wiring copper at the bottoms of the groove 54) having a pattern corresponding to an X-layer wiring pattern, thereby forming X-layer wiring conductors 55.

Figure 5H:
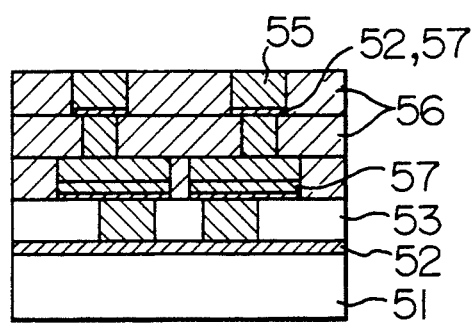

In FIG. 5H, an insoluble polyimide insulating film (permanent insulating film) 56 having a thickness of 20 μm is formed on the upper surface. Then, an aluminum film subjected to patterning is formed as a mask on the polyimide film, and grooves are formed in the polyimide film by an oxygen plasma. Then, the X-layer wiring conductors exposed in the grooves are dipped in an aqueous solution of copper sulfate, and copper is precipitated and filled in the grooves by electroplating, using these wiring conductors, thereby forming a via hole layer. An insoluble polyimide insulating film (permanent insulating film) 56 having a thickness of 20 μm is formed on the supper surface. Then, an aluminum film subjected to patterning is formed as a mask on the polyimide film, and grooves are formed in the polyimide film by an oxygen plasm, so that a metallic undercoat film, having a pattern corresponding to a Y-layer wiring pattern, is exposed at the bottoms of the grooves. Copper is precipitated and filled in the grooves by electroless plating to form electroless-plating conductors 57 having a thickness of 5 μm. Further, electroplating is carried out using, as an electrode, the metallic undercoat film 52 of Cr/Cu (which is connected to the via hole conductor copper at the bottoms of the grooves 54) having a pattern corresponding to the Y-layer wiring pattern, thereby forming Y-layer wiring conductors 55. Then, according to the procedure of formation of the X-layer wiring, a via hole layer, a ground layer and a via hole layer are sequentially formed in a laminated manner.

Figure 5I:
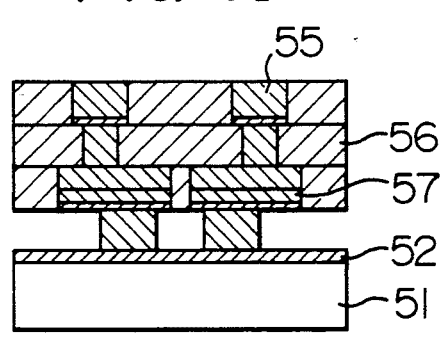

In FIG. 5I, the soluble polyimide insulating film 53 is dissolved and removed by a solvent.

Figure 5J:
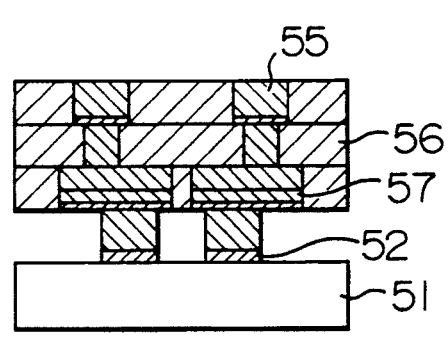

In FIG. 5J, the metallic undercoat film 52 at the lowermost layer except for those portions thereof disposed immediately beneath the via hole conductors is etched and removed by cerium (IV) ammonium sulfate dihydrate.

Figure 5K:
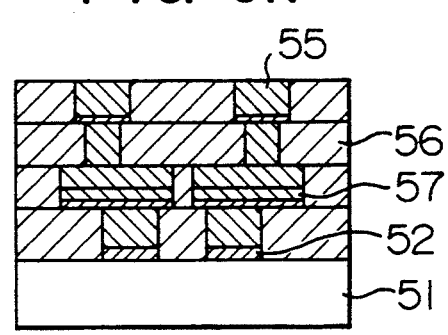

In FIG. 5K, the spaces, formed as a result of the removal of the soluble polyimide insulting film 53 by dissolving and as a result of removing the metallic undercoat film 52 by etching, are treated with polyimide varnish to insulatively cover the via hole copper.

With the above steps, one set of signal layers have been formed. If necessary, one or more sets of signal layers can be further formed on this first set of signal layers by repeating the steps of FIGS. 5B to 5K.

The metallic undercoat films of the wiring pattern for the electroless plating are provided at the X-layer and Y-layer, respectively, and these undercoat films need to be provided at least at those portions disposed immediately beneath the wiring conductors, but do not need to be provided over the entire surface. The via hole conductors are disposed in the ground layer in electrically interrupted relation to the ground layer, and are electrically connected to the Y-layer wiring beneath this ground layer. Therefore, the metallic undercoat film (serving as the common electrode) at the lowermost layer is not electrically connected to the metallic undercoat film at the ground layer, and therefore it is necessary to electrically connect the two together from the exterior.

EXAMPLE 4

FIGS. 6A–6K shows the sequence of steps of a method of producing a thin film multilayer wiring board according to the present invention. In the method of FIGS. 6A–6K, the step of forming a material capable of selective etching is added to the method of FIGS. 4A–4J.

Figure 6A:
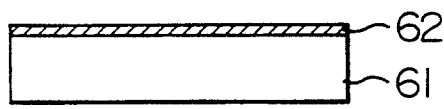
FIGS. 6A–6K are cross-sectional views showing the sequence of steps of another modified method of producing a thin film multilayer wiring board according to the present invention.

In FIG. 6A, a metallic undercoat film 62 of Ni/Cu having a thickness of 0.8 μm is formed by sputtering on a ceramics substrate 61 (which may have a multilayer wiring).

Figure 6B:
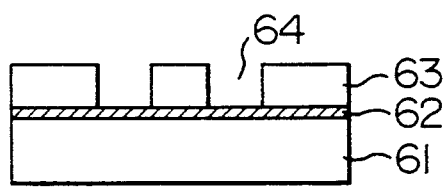

In FIG. 6B, a photoresist 63 having a thickness of 22 μm is coated on the metallic undercoat film 62 by a spinner, and grooves 64 are formed by exposure and development, so that the metallic undercoat film 62 is exposed at the bottoms of the grooves 64.

Figure 6C:
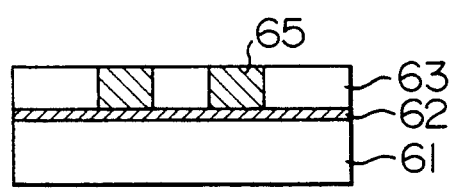

In FIG. 6C, the metallic undercoat film 62 is dipped in an aqueous solution of copper sulfate, and copper is precipitated and filled in the grooves 64 by electroplating, using the metallic undercoat film 62 as an electrode, thereby forming via hole wiring conductors 65.

Figure 6D:
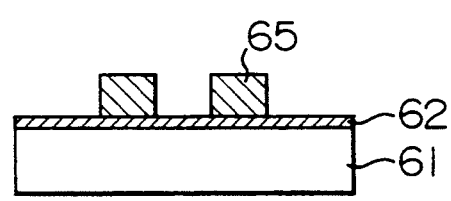

In FIG. 6D, the photoresist 63 is entirely dissolved and removed by a solvent.

Figure 6E:
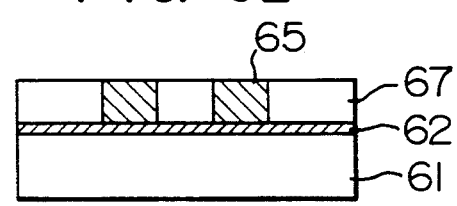

In FIG. 6E, Zn 67 is precipitated and filled in those portions, from which the photoresist 63 has been removed, by electroplating using the metallic undercoat film 62 as an electrode, thereby forming via hole wiring conductors 65. The Zn 67 precipitated on the via hole wiring 65 is removed, and the rinsing is carried out. With this procedure, the warp of the ceramics substrate 61 was greatly reduced.

Figure 6F:
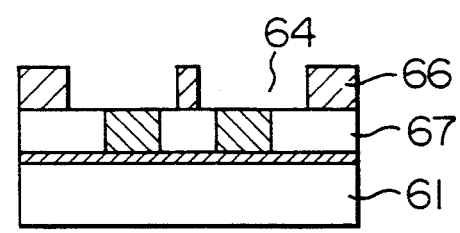

In FIG. 6F, an insoluble polyimide insulating film (permanent insulating film) 66 having a thickness of 22 μm is coated on the upper surface by a spinner, and is heated and cured. Then, grooves for forming an X-layer wiring are formed by ekishima laser, and the Zn 67 and the via hole wiring conductors 65 are exposed.

Figure 6G:
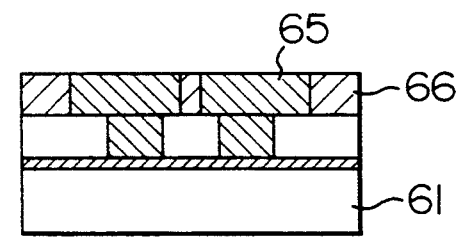

In FIG. 6G, since the Zn 67 and the via hole wiring conductors 65 have been exposed at the bottoms of the grooves 64, they are dipped in an aqueous solution of copper sulfate, and copper is precipitated and filled in the grooves 64 by electroplating using them as an electrode, thereby forming X-layer wiring conductors 65.

Figure 6H:
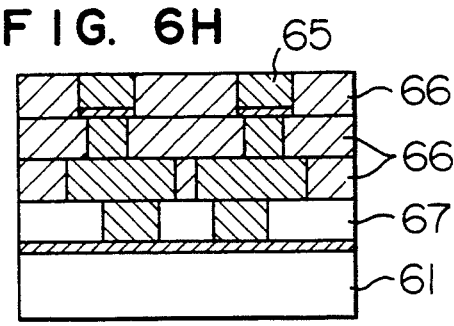

In FIG. 6H, an insoluble polyimide insulating film (permanent insulating film) 66 having a thickness of 20 μm is formed on the upper surface. Grooves are formed in the polyimide film by ekishima laser, and the X-layer wiring conductors 65 exposed in the grooves are dipped in an aqueous solution of copper sulfate, and copper is precipitated and filled in the grooves by electroplating using the exposed conductors 65 as an electrode, thereby forming a via hole layer. An insoluble polyimide insulating film (permanent insulating film) 66 having a thickness of 20 μm is formed on the upper surface. Grooves are formed by ekishima laser, so that a metallic undercoat film is exposed at the bottoms of the grooves. Electroplating is carried out using, as an electrode, the metallic undercoat film 62 of Cr/Cu (which is connected to the via hole conductor copper at the bottoms of the grooves 64) having a pattern corresponding to a Y-layer wiring pattern, thereby forming Y-layer wiring conductors 65. Then, according to the procedure of formation of the X-layer wiring, a via hole layer, a ground layer, a via hole layer are sequentially formed in a laminated manner.

Figure 6I:
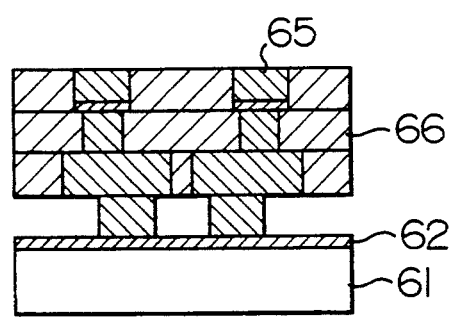

In FIG. 6I, Zn 67 is etched and removed, and the rinsing is carried out.

Figure 6J:
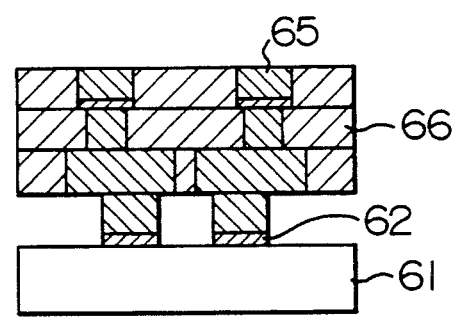

In FIG. 6J, the metallic undercoat film 62 at the lowermost layer except for those portions thereof disposed immediately beneath the via hole conductors is etched and removed by cerium (IV) ammonium sulfate dihydrate.

Figure 6K:
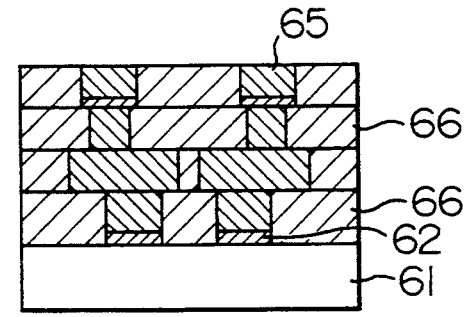

In FIG. 6K, the spaces, formed as a result of removing the Zn 67 and the metallic undercoat film 62 by etching, are treated with polyimide varnish to insulatively cover the Via hole copper.

With the above steps, one set of signal layers have been formed. If necessary, one or more sets of signal layers can be further formed on this first set of signal layers by repeating the steps of FIGS. 6B to 6K.

The metallic undercoat films of the wiring pattern for the electroplating are provided at the X-layer and Y-layer, respectively, and these undercoat films need to be provided at least at those portions disposed immediately beneath the wiring conductors, but do not need to be provided over the entire surface. The via hole conductors are disposed in the ground layer in electrically interrupted relation to the ground layer, and are electrically connected to the Y-layer wiring beneath this ground layer. Therefore, the metallic undercoat film (serving as the common electrode) at the lowermost layer is not electrically connected to the metallic undercoat film at the ground layer, and therefore it is necessary to electrically connect the two together from the exterior when carrying out the electroplating.

EXAMPLE 5

In this Example, as in Example 4, a thin film multilayer wiring board is produced according to the method of FIGS. 6A–6K. However, in this Example, Zn 67 is not precipitated on the via hole wiring conductors 65 of Example 4.

In FIG. 6A, a metallic undercoat film 62 of Ni/Cu having a thickness of 0.8 μm is formed by sputtering on a ceramics substrate 61 (which may have a multilayer wiring).

In FIG. 6B, a photoresist 63 having a thickness of 22 μm is coated on the metallic undercoat film 62 by a spinner, and grooves 64 are formed by exposure and development, so that the metallic undercoat film 62 is exposed at the bottoms of the grooves 64.

In FIG. 6C, the metallic undercoat film 62 is dipped in an aqueous solution of copper sulfate, and copper is precipitated and filled in the grooves 64 by electroplating, using the metallic undercoat film 62 as an electrode, thereby forming via hole wiring conductors 65.

In FIG. 6D, a thin film of a surface active agent containing fluorine is coated on the entire surfaces of the via hole wiring conductors 65, and is baked thereto. The photoresist 63 except for those portions thereof around the via hole wiring conductors 65 is dissolved and removed by a solvent.

In FIG. 6E, the metallic undercoat film 62 is dipped in an aqueous solution of copper sulfate, and Zn 67 is precipitated and filled in those portions, from which the photoresist 63 has been removed, by electroplating using the metallic undercoat film 62 as an electrode, thereby forming via hole wiring conductors 65. With this procedure, the warp of the ceramics substrate 61 was greatly reduced.

In FIG. 6F, an insoluble polyimide insulating film (permanent insulating film) 66 having a thickness of 22 μm is coated on the upper surface by a spinner, and is heated and cured. Then, grooves for forming an X-layer wiring are formed by ekishima laser, and the Zn 67 and the via hole wiring conductors 65 are exposed.

In FIG. 6G, since the Zn 67 and the via hole wiring conductors 65 have been exposed at the bottoms of the grooves 64, they are dipped in an aqueous solution of copper sulfate, and copper is precipitated and filled in the grooves 64 by electroplating using them as an electrode, thereby forming X-layer wiring conductors 65.

In FIG. 6H, an insoluble polyimide insulating film (permanent insulating film) 66 having a thickness of 20 μm is formed on the upper surface. Grooves are formed in the polyimide film by ekishima laser, and the X-layer wiring conductors 65 exposed in the grooves are dipped in an aqueous solution of copper sulfate, and copper is precipitated and filled in the grooves by electroplating using the exposed conductors 65 as an electrode, thereby forming a via hole layer. Further, an insoluble polyimide insulating film (permanent insulating film) 66 having a thickness of 20 μm is formed on the upper surface. Grooves are formed by ekishima laser, so that a metallic undercoat film is exposed at the bottoms of the grooves. Electroplating is carried out using, as an electrode, the metallic undercoat film 62 of Cr/Cu (which is connected to the via hole conductor copper at the bottom of the grooves 64) having a pattern corresponding to a Y-layer wiring pattern, thereby forming Y-layer wiring conductors 65. Then, according to the procedure of formation of the X-layer wiring, a via hole layer, a ground layer, a via hole layer are sequentially formed in a laminated manner.

In FIG. 6I, Zn 67 is etched and removed, and the rinsing is carried out.

In FIG. 6J, the metallic undercoat film 62 at the lowermost layer except for those portions thereof disposed immediately beneath the via hole conductors is etched and removed by cerium (IV) ammonium sulfate dihydrate.

In FIG. 6K, the spaces, formed as a result of removing the Zn 67 and the metallic undercoat film 62 by etching, are treated with polyimide varnish to insulatively cover the via hole copper.

With the above steps, one set of signal layers have been formed. If necessary, one or more sets of signal layers can be further formed on this first set of signal layers by repeating the steps of FIGS. 6B to 6K.

The metallic undercoat films of the wiring pattern for the electroplating are provided at the X-layer and Y-layer, respectively, and these undercoat films need to be provided at least at those portions disposed immediately beneath the wiring conductors, but do not need to be provided over the entire surface. The via hole conductors are disposed in the ground layer in electrically interrupted relation to the ground layer, and are electrically connected to the Y-layer wiring beneath this ground layer. Therefore, the metallic undercoat film (serving as the common electrode) at the lowermost layer is not electrically connected to the metallic undercoat film at the ground layer, and therefore it is necessary to electrically connect the two together from the exterior when carrying out the electroplating.

EXAMPLE 6

FIGS. 7A-7J shows the sequence of a method of steps of producing a thin film multilayer wiring board according to the present invention. In the method of FIGS. 7A-7J, unlike Examples 1 to 5, a step of the method is applied to a lower surface of a substrate. A metallic film is formed over an entire surface of a ceramics substrate to made all of I/O pin-side terminals conductive.

Figure 7A:
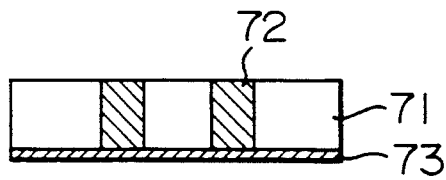
FIGS. 7A–7J are cross-sectional views showing the sequence of steps of a further modified method of producing a thin film multilayer wiring board according to the present invention.

In FIG. 7A, a film of Cr (0.05 μm) and a film of Cu (0.5 μm) are formed by sputtering on an entire lower surface (I/O pin-side surface) of an alumina substrate 71 (which may have a multilayer wiring) of a square shape (100 mm × 100 m; thickness: 1 mm) to thereby provide a metallic film 73 of Cr/Cu. This Cr/Cu metallic film is used as a common electrode at a later stage. The wiring of the alumina substrate 71 is constituted only by through hole wiring conductors.

Figure 7B:
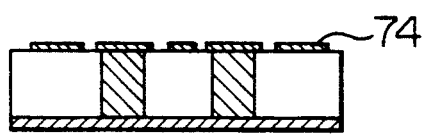

In FIG. 7B, a metallic undercoat film 74 of Cr/Cu having a thickness of 0.8 μm is formed by sputtering on those portions of the upper surface of the alumina substrate 71 (100 mm × 100 mm; thickness: 1 mm) on which ground conductors and via hole conductors are to be formed.

Figure 7C:
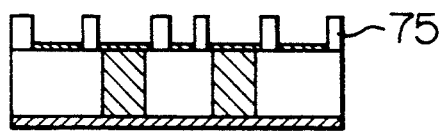

In FIG. 7C, an insoluble polyimide film 75 (20 μm thick) with an epoxy adhesive is bonded to the upper surface, and is cured. Then, grooves, arranged in a pattern corresponding to the patterns of the ground and the via holes, are formed in the polyimide film by ekishima laser through a mask, so that the metallic undercoat film 74 is exposed at the bottom of the grooves.

Figure 7D:
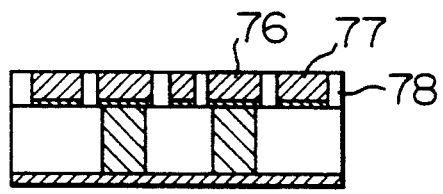

In FIG. 7D, the metallic undercoat film 74 is dipped in an aqueous solution of copper sulfate, and copper is precipitated and filled in the grooves by electroplating using the metallic undercoat film 74 as an electrode, thereby forming via hole wiring conductors 76 and ground wiring conductors 77.

Figure 7E:
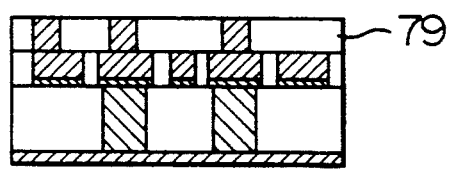

In FIG. 7E, an insoluble polyimide film with an epoxy adhesive is bonded, and heated and cured, and grooves, arranged in a pattern corresponding to a via hole pattern, are formed in the polyimide film by ekishima laser through a mask. Using an aqueous solution of copper sulfate, electroplating is carried out using the via hole conductors (disposed below this polyimide film) as an electrode, thereby forming via hole conductors to form a via hole conductor layer 79.

Figure 7F:
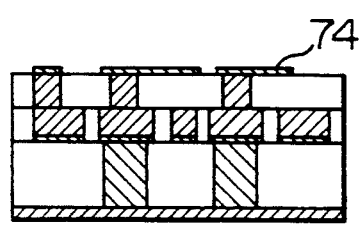

In FIG. 7F, a metallic undercoat film 74 of Cr/Cu, having a pattern corresponding to an X-layer wiring pattern, is formed by sputtering.

Figure 7G:
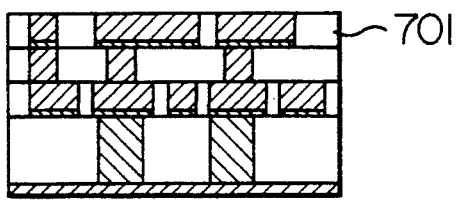

In FIG. 7G, an insoluble polyimide film with an epoxy adhesive is bonded, and heated and cured. Grooves, arranged in a pattern corresponding to the X-layer wiring pattern, are formed in the polyimide film by ekishima laser. Using an aqueous solution of copper sulfate, X-layer wiring conductors are precipitated by electroplating using the metallic undercoat film 74 as an electrode, thereby forming X-layer wiring conductors 701.

Figure 7H:
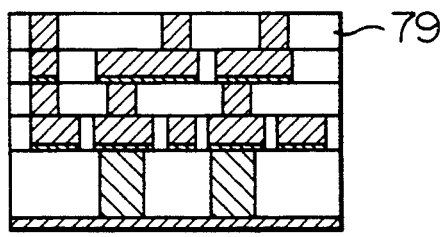

In FIG. 7H, via hole conductors 79 are formed according to the above procedure.

Figure 7I:
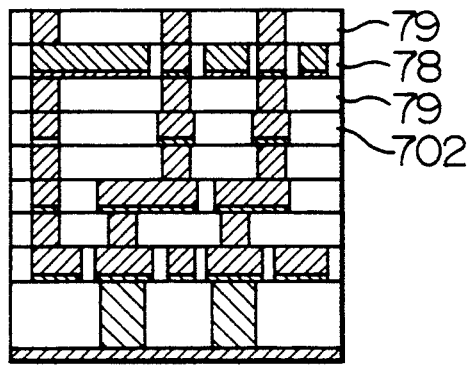

In FIG. 7I, according to the above procedure, a Y-layer wiring layer 702, a via hole conductor layer 79, an upper ground layer 78 and a via hole conductor layer 79 are sequentially formed.

Figure 7J:
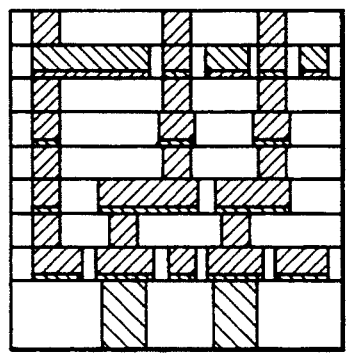

In FIG. 7J, the Cr/Cu metallic film 73 on the lower surface of the substrate is etched and removed by cerium (IV) ammonium sulfate dihydrate, thereby completing one set of signal layers.

EXAMPLE 7

Figure 8:
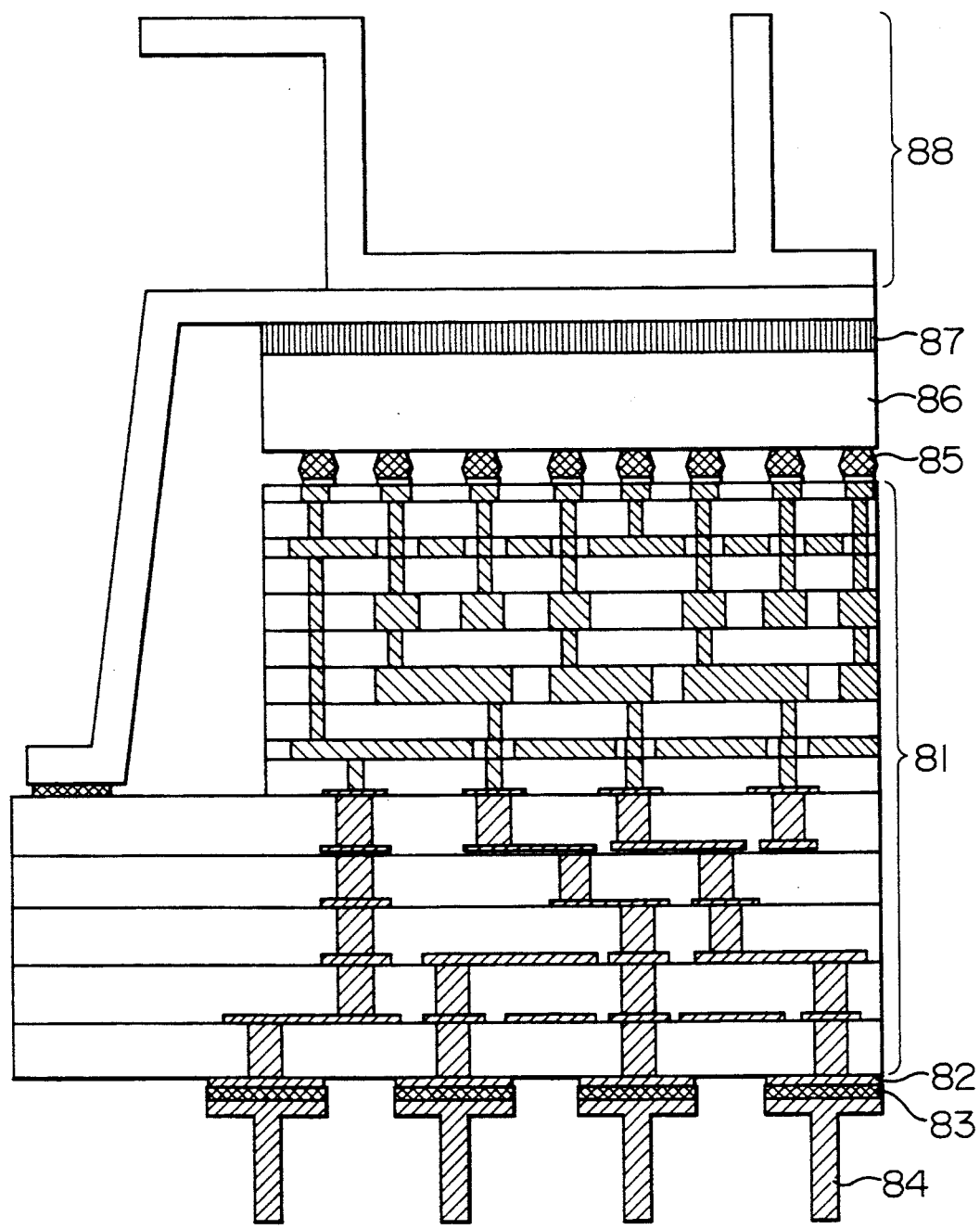
FIG. 8 is a cross-sectional view of a module using thick and thin film multilayer wiring boards of the invention.
Figure 9:
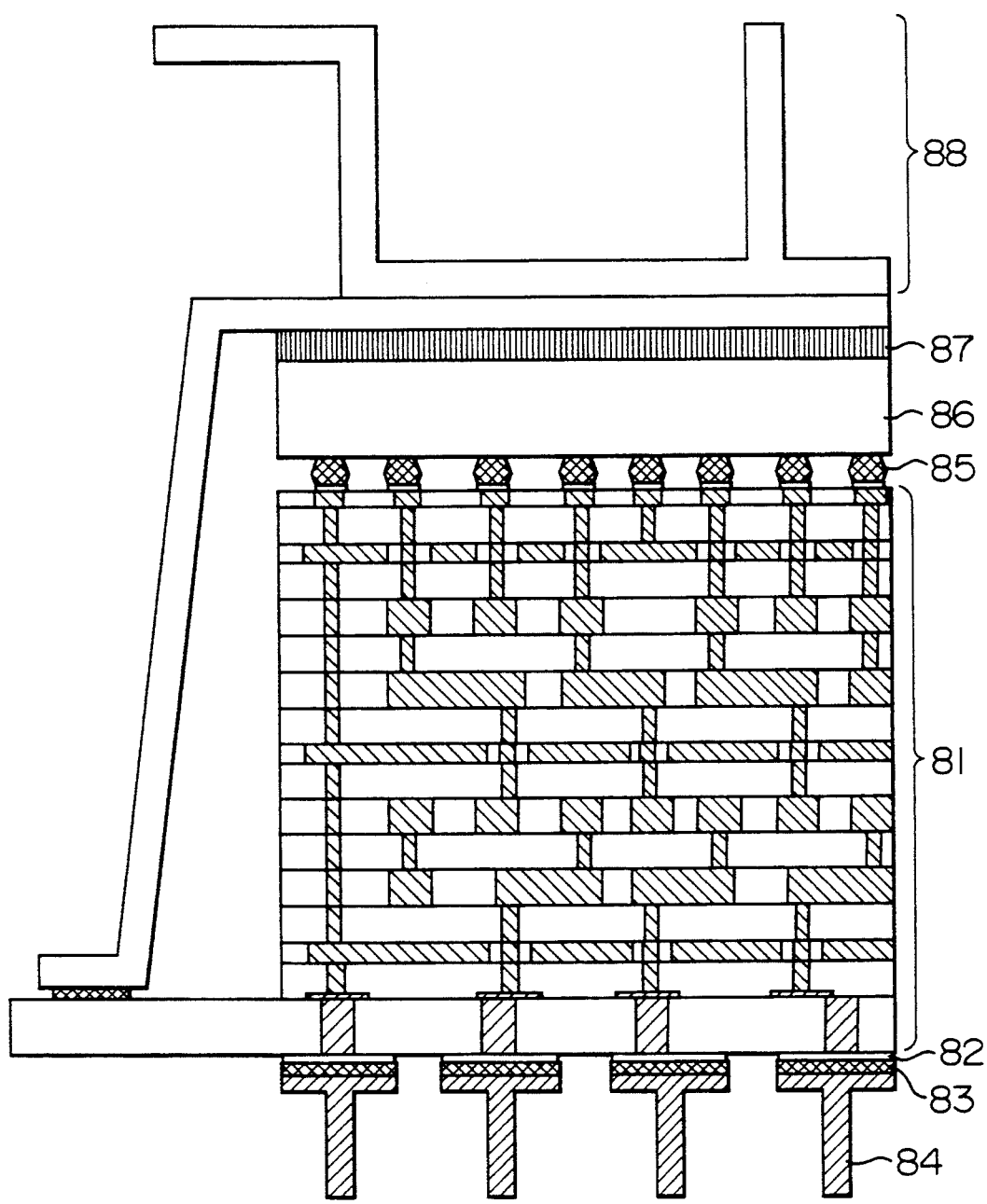
FIG. 9 is a cross-sectional view of a module using thin film multilayer wiring boards of the invention.

Modules are produced using the thin film multilayer wiring boards produced in Example 2 and Example 6. FIG. 8 shows the module using the thick and thin film multilayer wiring board (having thick layers and thin layers) of Example 2. FIG. 9 shows the module using thin film multilayer wiring board (all layers are thin) of Example 6.

High-temperature solder 83 is placed on each of pin-connecting pads 82 formed on the reverse surface of the thick and thin film multilayer wiring board 81 produced in Example 2. A pin 84, which is heated to about 350° C. only at its connecting portion and is received in a guide hole, is connected and secured to the pad 82 through the solder 83. Then, solder 85 is placed on each of semiconductor-mounting pads formed on the front surface of the board, and is heated to a temperature of about 250° C., and four LSIs 86 are electrically connected and secured to these pads through the solder 85. Then, a rubber plate 87, having electrical conductivity, a good thermal conductivity and heat resistance, is adhesively bonded to the reverse surface of each LSI. Finally, low-temperature solder is placed on a solder seal portion on the surface of the board, and is heated to about 200° C., and a covar seal cap, having an integral cooling fan 88 for cooling the LSIs, is connected to the solder seal portion through the solder in such a manner that the inner surface of the seal cap is held in contact with the rubber plate 87, thereby completing the module.

Similarly, the module is produced using the thin film multilayer wiring board of Example 6.

One of the above four LSIs is a logic LSI, and the other three are memory LSIs.

EXAMPLE 8

A computer is produced using the modules of Example 7. FIG. 10 shows a logic package of the computer using the modules of Example 7.

In FIG. 10, sixteen (16) modules 101 of Example 7 are mounted on a printed circuit board 102 to form the logic package of the computer. Then, a memory package and an input/output processing package are combined with this logic package to form the computer.

COMPARATIVE EXAMPLE 1

The conventional method of producing the thin film multilayer wiring board has the problem that the time for producing the wiring board is long, and also has the problem that the substrate is warped. Namely, while the polyimide films are repeatedly formed, the substrate is warped due to stresses developing in the interior. This warp adversely affects the grinding and polishing operation for flattening purposes. Also, the warp makes it difficult to perform the exposure of a large-area substrate at a time, and therefore the exposure must be done by a step-and-repeat method, which is a major factor in lowering a throughput. In a board for a high-speed transfer circuit of a computer, it is preferable that the substrate be provided with the smallest thickness. Preferably, this thickness should be not more than 1 mm, and under the circumstances, it is difficult to prevent the warp of the substrate by increasing the thickness of the substrate.

Figure 11A:
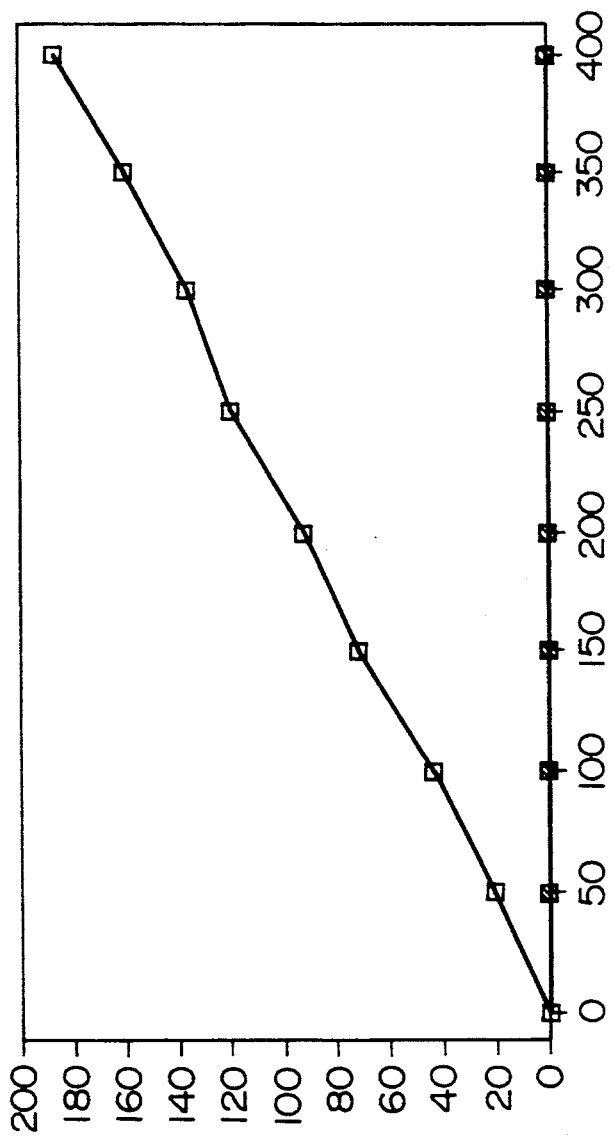
FIG. 11 is an illustration showing the relation between a polyimide film thickness and a warp of a substrate.
Figure 11B:
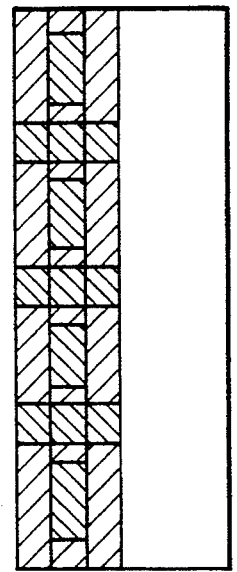
Figure 11C:
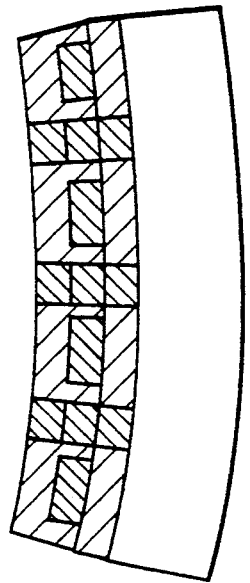

FIG. 11 shows the relation between the thickness of a polyimide film (PIQ; manufactured by Hitachi Kasei K. K.) and a warp of a substrate. Polyimide varnish PIQ is coated in up to 32 layers (each having a thickness of 12.5 mm after baking) on an alumina substrate (thickness: 1 mm; square shape (100 mm×100 mm); elastic modulus: $35\times 10^{10}$Pa; Poisson's ratio v: 0.27). The standard baking conditions are adopted. Namely, the baking time is 30 minutes, and the baking temperature is 140° C., 200° C. and 350° C. The warp of the substrate on the thin film side was measured using a wide-range thin film step meter. The warp of the substrate reaches a large value of 180 μm when the thickness of the polyimide film is 400 μm. Namely, in the exposure and development step, when the warp is large, a fuzz or haze develops in the transfer of a mask pattern, so that a proper pattern transfer can not be effected, which prevents a high-precision design of the circuit. It has been confirmed by our experiments that the allowable upper limit for the warp is 10 μm. Therefore, unless the warp of the substrate is greatly reduced, the number of layers to be formed can not be increased in the conventional method. This is a major obstacle to the demand for the multilayer construction.

On the other hand, in the present invention, when a plurality of layers are to be formed on the same substrate as described above, using polyimide films (film-like material) (20 μm thick) each having an epoxy resin adhesive (1 to 3 μm thick), thermal stresses are so small as to hardly cause a warp, because even if the films have the same nature as PIQ, the thickness of the adhesive layer is very thin, and the epoxy resin can be cured at low temperatures of not more than 100° C. If the film is compressed and bonded by a hot press of an excellent flatness, the flatness of the surface of the hot press is transferred to the film, and the substrate is not warped. Therefore, with the film bonding method of the present invention, the multilayer construction can be suitably achieved, and in the present invention, the multilayer construction having up to 100 layers can be achieved, whereas in the conventional method, the upper limit of the multilayer construction is 10 layers or so.

Further, the polyimide is used in the cured form (that is, in the form of a film material), and therefore unlike the varnish polyimide, the polyimide film, having a thermal expansion coefficient (3 to 10 ppm°C$^{-1}$) several times lower than that of PIQ, can be used. As the thermal expansion coefficient of polyimide decreases, a problem arises in that the polyimide film can not be bonded to the substrate and another polyimide film. The limit of the thermal expansion coefficient in this case is about 10° to 18° C.$^{-1}$. When the polyimide is used in the form of a film material as described above, the adhesive bonding is carried out not by mutual fusion of the polyimide molecules, but by the epoxy resin having an extremely higher adhesive strength than the polyimide. The range of choice of the epoxy resin is wide, and a considerable degree of freedom is obtained with respect to its choice, and the thickness of the adhesive layer is extremely small, and even if the thermal expansion coefficient of the polyimide is greatly decreased, this will not adversely affect the adhesive bonding because the adhesive bonding is carried out by the epoxy resin. Incidentally, instead of using the polyimide film having the epoxy resin coated thereon, an epoxy resin may be coated on the substrate in which case the polyimide film is bonded to this epoxy resin.

As described above, the film bonding method of the present invention is quite effective in decreasing the thermal stresses, and can contribute to the reduction of the warp and the multilayer construction.

What is claimed is:

1. A thin film multilayer wiring board-producing method comprising the steps of:
    (1) forming a first metallic undercoat film on a substrate, then forming a soluble insulating film on said metallic undercoat film, forming grooves in said soluble insulating film so that at least a part of the metallic undercoat film is exposed at the bottom of each of the grooves, and then filling a first conductor in said grooves by electroplating, thereby forming a first layer;
    (2) subsequently forming an insoluble insulating film on said first layer or on a patterned metallic undercoat film formed on said first layer, which metallic undercoat film is electrically connected to said conductor provided in the first layer, forming grooves in said insoluble insulating film so that at least a part of the first layer or the metallic undercoat layer formed on said first layer is exposed at the bottom of each of the grooves, and then filling a second conductor in said grooves by the use of electroplating or both electroless plating and electroplating, thereby forming a second layer on said first layer or on the metallic undercoat film formed on said first layer; and
    (3) subsequently removing said soluble insulating film and a part of said first metallic undercoat film which is exposed, and then forming an insoluble insulating film at those portions from which said soluble insulating film and said first metallic undercoat film have been removed.

2. A thin film multilayer wiring board-producing method comprising the steps of:
    (1) forming a first metallic undercoat film on a substrate, then forming a soluble insulating film on said metallic undercoat film, forming grooves in said soluble insulating film so that at least a part of the metallic undercoat film is exposed at the bottom of each of the grooves, and then filling a first conductor in said grooves by electroplating, thereby forming a first layer;
    (2) subsequently forming an insoluble insulating film on said first layer or on a patterned metallic undercoat film formed on said first layer, which metallic undercoat film is electrically connected to said conductor provided in the first layer, forming grooves in said insoluble insulating film so that at least a part of the first layer or the metallic undercoat layer formed on the first layer is exposed at the bottom of each of the grooves, and then filling a second conductor in said grooves by the use of electroplating or both electroless plating and electroplating, thereby forming a second layer on said first layer or on the metallic undercoat layer formed on the first layer;
    (3) subsequently repeating said step (2) one or more times to provide a multilayer construction; and
    (4) subsequently removing said soluble insulating film and a part of said first metallic undercoat film which is exposed, and forming an insoluble insulating film at those portions from which said soluble insulating film and said first metallic undercoat film have been removed.

* * * * *